United States Patent
Tanaka et al.

(10) Patent No.: US 9,520,802 B2
(45) Date of Patent: Dec. 13, 2016

(54) POWER SEMICONDUCTOR MODULE, POWER CONVERTING APPARATUS AND RAILWAY CAR

(75) Inventors: Takeshi Tanaka, Tokyo (JP); Yasushi Nakayama, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 1188 days.

(21) Appl. No.: 13/517,904

(22) PCT Filed: Jan. 18, 2010

(86) PCT No.: PCT/JP2010/050512
§ 371 (c)(1),
(2), (4) Date: Jun. 20, 2012

(87) PCT Pub. No.: WO2011/086705
PCT Pub. Date: Jul. 21, 2011

(65) Prior Publication Data
US 2012/0256574 A1 Oct. 11, 2012

(51) Int. Cl.
*H02P 6/14* (2016.01)
*H02M 7/00* (2006.01)
(Continued)

(52) U.S. Cl.
CPC .............. *H02M 7/003* (2013.01); *B60L 3/003* (2013.01); *B60L 7/14* (2013.01); *B60L 11/1803* (2013.01);
(Continued)

(58) Field of Classification Search
USPC .... 318/400.27, 400.17, 400.26, 400.29, 801, 318/803; 438/142, 613, 519, 522, 965, 318/268, 438/931, 105, 317; 257/288, 257/341, 350, E29.027, 257/E29.197, 77, 257/281; 363/56.01, 141, 126; 310/12.09; 361/216, 806, 783
See application file for complete search history.

(56) References Cited

U.S. PATENT DOCUMENTS

| | | | |
|---|---|---|---|
| 5,661,644 A | 8/1997 | Bergman et al. | |
| 8,168,985 B2 * | 5/2012 | Arai | H01L 21/8213 257/181 |

(Continued)

FOREIGN PATENT DOCUMENTS

| | | | |
|---|---|---|---|
| JP | 11-510000 A | | 8/1999 |
| JP | 2001045772 A | * | 2/2001 |

(Continued)

OTHER PUBLICATIONS

International Search Report (PCT/ISA/210) issued on Mar. 30, 2010, by the Japanese Patent Office as the International Searching Authority for International Application No. PCT/JP2010/050512.

(Continued)

*Primary Examiner* — Kawing Chan
(74) *Attorney, Agent, or Firm* — Buchanan Ingersoll & Rooney PC

(57) ABSTRACT

A power semiconductor module applied to a power converting apparatus for a railway car includes an element pair formed by connecting an IGBT and an SiC-FWD in anti-parallel to each other and an element pair formed by connecting an Si-IGBT and an SiC-FWD in anti-parallel to each other. The element pair and the element pair are housed in one module and configured as a 2-in-1 module in a manner that the first element pair operates as a positive side arm of the power converting apparatus and the second element pair operates as a negative side arm of the power converting apparatus. The element pairs are formed such that a ratio of an occupied area of SiC-FWD chips to an (Continued)

occupied area of IGBT chips in the element pairs is equal to or higher than 15% and lower than 45%.

13 Claims, 6 Drawing Sheets

(51) Int. Cl.
*B60L 3/00* (2006.01)
*B60L 7/14* (2006.01)
*B60L 11/18* (2006.01)
*B60L 15/00* (2006.01)

(52) U.S. Cl.
CPC .......... *B60L 15/007* (2013.01); *B60L 2200/26* (2013.01); *H01L 2924/0002* (2013.01); *Y02T 10/645* (2013.01); *Y02T 10/7005* (2013.01)

(56) References Cited

U.S. PATENT DOCUMENTS

| | | | | |
|---|---|---|---|---|
| 2003/0155644 A1* | 8/2003 | Hirao | .................... | H01L 23/051 257/706 |
| 2004/0188706 A1* | 9/2004 | Chang | ................... | H01L 25/072 257/177 |
| 2007/0090496 A1* | 4/2007 | Otremba | ........... | H01L 23/49513 257/666 |
| 2007/0158778 A1* | 7/2007 | Kitabatake | .......... | H01L 21/8213 257/493 |
| 2007/0252178 A1* | 11/2007 | Onose | ................. | H01L 29/0692 257/270 |
| 2008/0093730 A1* | 4/2008 | Furuta | ................... | H01L 23/367 257/712 |
| 2008/0291710 A1* | 11/2008 | Aoki | .................... | H01L 23/473 363/131 |
| 2009/0057929 A1* | 3/2009 | Sasaki | ................. | H01L 23/3107 257/796 |

FOREIGN PATENT DOCUMENTS

| | | | |
|---|---|---|---|
| JP | 2001-245479 | A | 9/2001 |
| JP | 2005-005593 | A | 1/2005 |
| JP | 2005005593 | A * | 1/2005 |
| JP | 2009-059923 | A | 3/2009 |

OTHER PUBLICATIONS

Written Opinion (PCT/ISA/237) issued on Mar. 30, 2010, by the Japanese Patent Office as the International Searching Authority for International Application No. PCT/JP2010/050512.

* cited by examiner

POWER SEMICONDUCTOR MODULE, POWER CONVERTING APPARATUS AND RAILWAY CAR

FIELD

The present invention relates to a power converting apparatus applicable to a railway car and, more particularly, to a power semiconductor module mountable on the power converting apparatus of this type.

BACKGROUND

Although not limited to the use in railway cars, as a power semiconductor module applicable to the use for relatively-high output power conversion, there is a power semiconductor module disclosed in Patent Literature 1 mentioned above, for example. For the power semiconductor module described in Patent Literature 1, a configuration is disclosed that includes two sets of element pairs each formed by connecting a switching element called IGBT (Insulated Gate Bipolar Transistor) and a diode element called fry wheel diode (FWD) in anti-parallel to each other. In other words, the power semiconductor module is configured as a power semiconductor module of so-called "2-in-1" (see FIGS. 1 to 4 and more of the literature).

CITATION LIST

Patent Literature

Patent Literature 1: Japanese Patent Application Laid-open No. 2009-059923

SUMMARY

Technical Problem

When the sets of element pairs constituting a 2-in-1 type power semiconductor module (hereinafter referred to as "2-in-1 module" according to necessity) as mentioned above are connected in series in a module, the element pairs can be used as negative arm elements on a positive side and a negative side in an inverter and a converter. Therefore, for example, a three-phase inverter can be configured by three 2-in-1 modules. This enables reduction in size of the apparatus.

However, it has been not easy to apply the 2-in-1 module to an inverter for a railway car. This is because, when the power semiconductor module is applied to a railway car, in a power running mode in which a car accelerates, a large electric current flows mainly in the IGBT side. In a regenerative mode in which the car regenerates electric power with a brake and decelerates, a large electric current flows mainly in the FWD side. Therefore, in the power running mode, the IGBTs generate high heat and, in the regenerative mode, the FWDs generate high heat. For this reason, an electric current and a switching frequency have to be set or controlled such that a bonding temperature for IGBT chips in the power running mode and a bonding temperature for FWD chips in the regenerative mode become equal to or lower than their respective allowable bonding temperatures.

However, in the present 2-in-1 module, it has been difficult to set the electric current and the switching frequency such that the bonding temperature for the FWD chips in the regenerative mode becomes equal to or lower than the allowable bonding temperature. The size of the IGBT chips and the size of the FWD chips are in a trade-off relation. Therefore, it is also conceivable to reduce the size of the IGBT chips and allocate the reduction to the FWD chips. However, in the present 2-in-1 module, the chip size of the IGBT is set as small as possible. A further reduction in size exceeds a limit because it is difficult to secure an electric current capacity in the power running mode. Therefore, in the three-phase inverter in the present railway application, a power semiconductor module of the same electric current class has to be configured using six power semiconductor modules of so-called "1-in-1" (hereinafter referred to as "1-in-1 modules" according to necessity), in each of which one set of an IGBT and an FWD are mounted. So, it is difficult to further reduce the size of a power converting apparatus.

The present invention has been devised in view of the above-mentioned circumstances, and it is an object of the present invention to provide a power semiconductor module that can be further downsized and is applicable to a power converting apparatus for a railway car.

It is another object of the present invention to provide a 2-in-1 type power semiconductor module that can compatibly use the existing 1-in-1 type module without increasing the module size thereof.

It is still another object of the present invention to provide a power converting apparatus including a power semiconductor module as mentioned above and a railway car including a power converting apparatus as mentioned above.

Solution to Problem

In order to solve the above-mentioned problems and achieve the objects, the present invention provides a power semiconductor module applied to a power converting apparatus for a railway car, the power semiconductor module comprising: a first element pair formed by connecting a first switching element and a first diode element in anti-parallel to each other; and a second element pair formed by connecting a second switching element and a second diode element in anti-parallel to each other, wherein the first and second diode elements are formed of wideband gap semiconductor; and the first element pair and the second element pair are housed in one module and configured as a 2-in-1 module in a manner that the first element pair operates as a positive side arm of the power converting apparatus and the second element pair operates as a negative side arm of the power converting apparatus.

Advantageous Effects of Invention

With the power semiconductor module according to the present invention, there is an advantageous effect that it is possible to provide a power semiconductor module of the 2-in-1 type that can use the existing module of the 1-in-1 type without increasing the module size and is applicable to a railway car.

DESCRIPTION OF EMBODIMENTS

The inventor of this application focused on an SiC diode that can reduce an ON voltage and, as a result, can substantially reduce a recovery loss. The inventor came to derive a power semiconductor module and a power converting apparatus suitable for a railway application by applying the SiC diode to the 2-in-1 module to configure a power converting apparatus. A power semiconductor module and a power converting apparatus according to an embodiment of the present invention are described below with reference to the accompanying drawings. The present invention is no limited to the embodiments described below.

Embodiment

Figure 1:
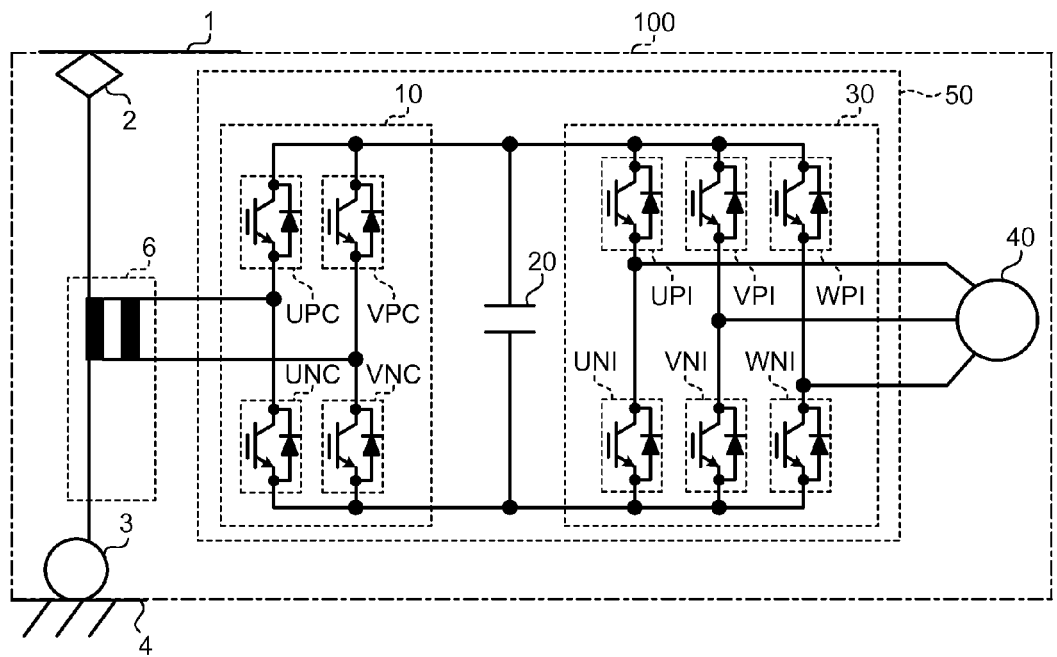
FIG. 1 is a diagram of a schematic functional configuration showing a power converting apparatus according to an embodiment of the present invention.

First, a power converting apparatus according to an embodiment of the present invention is described. FIG. 1 is a diagram showing a schematic functional configuration of the power converting apparatus according to this embodiment. A configuration example of a power converting apparatus 50 mounted on a railway car 100 is shown. As shown in the figure, the power converting apparatus 50 includes a converter 10, a capacitor 20 and an inverter 30. The railway car 100 is mounted with a transformer 6 that is arranged on an input end side of the power converting apparatus 50 and connected to the converter 10, and a motor 40 that is arranged on an output end side of the power converting apparatus 50, connected to the inverter 30 and receives power supply from the power converting apparatus 50 to drive the car. As the motor 40, an induction motor or a synchronous motor is suitable.

One end of a primary winding of the transformer 6 is connected to an overhead line 1 via a current collector 2. The other end of the primary winding is connected to a rail 4, which is ground potential, via a wheel 3. Electric power supplied from the overhead line 1 is inputted to the primary winding of the transformer 6 via the current collector 2, while electric power generated in a secondary winding of the transformer 6 is inputted to the converter 10.

The converter 10 includes circuit sections (hereinafter referred to as "legs") in which a positive side arm composed of switching elements UPC and VPC (e.g., for a U phase, UPC) and a negative side arm composed of switching elements UNC and VNC (e.g., for the U phase, UNC) are respectively connected in series. In other words, in the converter 10, a single-phase bridge circuit including two sets (for a U phase and a V phase) of legs is configured.

The converter 10 subjects the switching elements UPC, VPC, UNC and VNC to PWM control to convert an input alternating-current voltage into a desired direct-current voltage and output the direct-current voltage.

An output end of the converter 10 is connected to the capacitor 20 functioning as a direct-current power supply in parallel, and connected to the inverter 30 that receives a direct-current voltage of the capacitor 20 as an input, converts the direct-current voltage into an alternating-current voltage having an arbitrary voltage and an arbitrary frequency, and outputs the alternating-current voltage.

The inverter 30 includes legs in which a positive side arm composed of switching elements UPI, VPI and WPI (e.g., for the U phase, UPI) and a negative side arm composed of switching elements UNI, VNI and WNI (e.g., for the U phase, UNI) are respectively connected in series. In other words, in the inverter 30, a three-phase bridge circuit including three sets (for the U phase, the V phase and the W phase) of legs is configured.

The inverter 30 subjects the switching elements UPI, VPI, WPI, UNI, VNI and WNI to PWM control to convert an input direct-current voltage into a desired alternating-current voltage and outputs the alternating-current voltage.

In FIG. 1, as a preferred example of the power converting apparatus according to this embodiment, there is shown one case where the power converting apparatus is applied to an alternating-current input electric rolling stock. However, the power converting apparatus can also be applied to a direct-current input electric rolling stock frequently used in subways, suburban electric rolling stocks or the like in the same manner. When the power converting apparatus is applied to the direct-current input electric rolling stock, a configuration equivalent to the configuration shown in FIG. 1 can be adopted except that the configuration of the transformer 6 and the converter 10 is unnecessary. It is naturally possible to apply the contents according to this embodiment to the direct-current input electric rolling stock.

Figure 2:
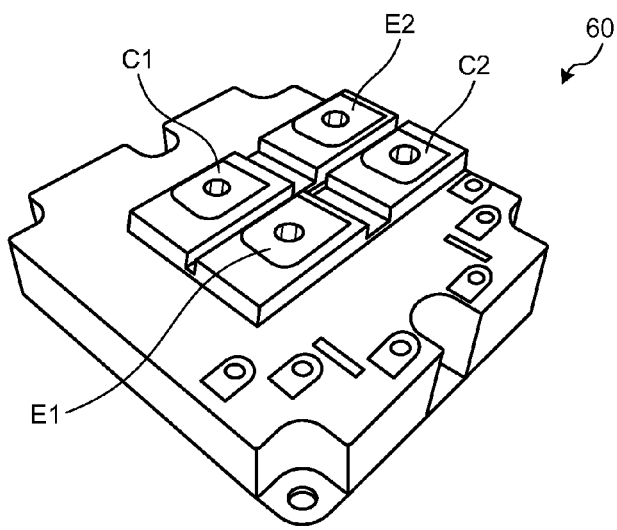
FIG. 2 is a perspective view showing a schematic shape of a power semiconductor module according to the present embodiment configured as a 2-in-1 module.
Figure 3:
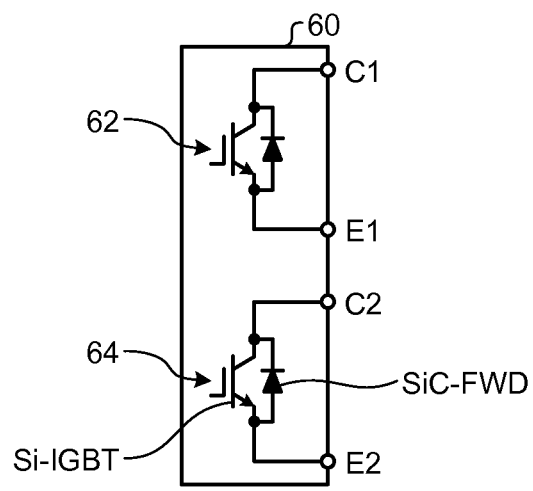
FIG. 3 is a diagram schematically showing a circuit configuration of the power semiconductor module shown in FIG. 2.
Figure 4:
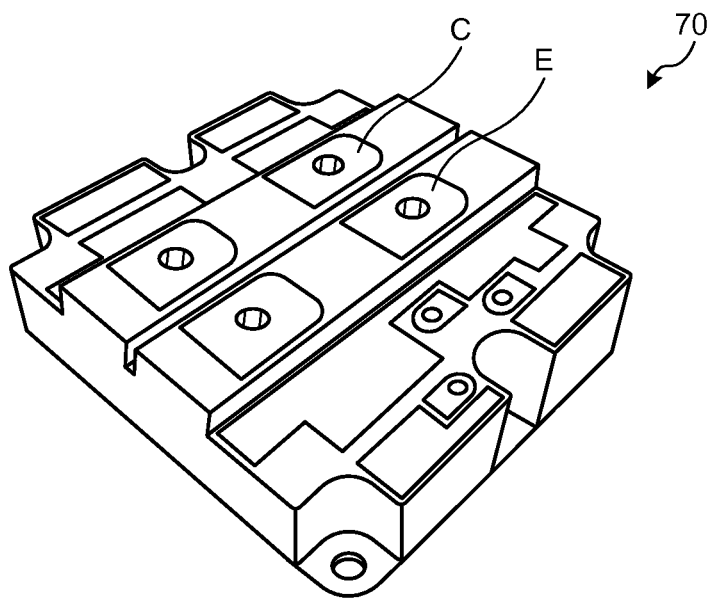
FIG. 4 is a perspective view showing a schematic shape of a 1-in-1 module used in the past.
Figure 5:
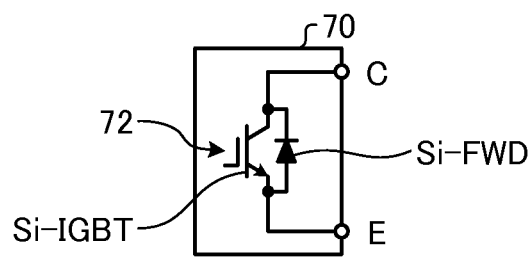
FIG. 5 is a diagram schematically showing a circuit configuration of the power semiconductor module shown in FIG. 4.

A power semiconductor module used in the power converting apparatus according to this embodiment is explained. FIG. 2 is a perspective view showing a schematic shape of a power semiconductor module according to this embodiment configured as a 2-in-1 module. FIG. 3 is a diagram schematically showing a circuit configuration owned by the power semiconductor module shown in FIG. 2. FIG. 4 is a perspective view showing a schematic shape of a power semiconductor module shown as a comparative example, which is a 1-in-1 module used in the past. FIG. 5 is a diagram schematically showing a circuit configuration owned by the power semiconductor module shown in FIG. 4.

As shown in FIGS. 4 and 5, in a 1-in-1 module 70 used in the past, one set of element pair 72 in which a silicon-based IGBT (Si-IGBT) and a silicon-based FWD (Si-FWD) are connected in anti-parallel to each other is housed in a package. A collector of the Si-IGBT and a cathode of the Si-FWD are connected within the module. A connection end of the collector and the cathode is drawn out and connected to a collector electrode C provided on the upper surface of the 1-in-1 module 70. Similarly, an emitter of the Si-IGBT and an anode of the Si-FWD are connected within the module. A connection end of the emitter and the anode is drawn out and connected to an emitter electrode E provided on the upper surface of the 1-in-1 module 70.

On the other hand, as shown in FIGS. 2 and 3, in a 2-in-1 module 60 according to this embodiment, a first element pair 62 and a second element pair 64, which are two sets of element pairs, in each of which silicon (Si)-based IGBT (Si-IGBTs) and silicon carbide (SiC)-based FWD (SiC-FWD) are connected in anti-parallel to each other, are housed in a package.

Silicon carbide (SiC) is one example of semiconductor called wideband gap semiconductor. Besides silicon carbide, for example, semiconductor formed using a gallium nitride based material or diamond also belongs to the wideband gap semiconductor. Therefore, a configuration in which other wideband gap semiconductor different from silicon carbide is used may also constitute the gist of the present invention.

In FIGS. 2 and 3, in the first element pair 62, a collector of the Si-IGBT and a cathode of the SiC-FWD are connected within the module. A connection end of the collector and the cathode is drawn out and connected to a collector electrode C1 provided on the upper surface of the 2-in-1 module 60. An emitter of the Si-IGBT and an anode of the SiC-FWD are connected within the module. A connection end of the emitter and the anode is drawn out and connected to an emitter electrode E1 provided on the upper surface of the 2-in-1 module 60. Similarly, in the second element pair 64, a collector of the Si-IGBT and a cathode of the SiC-FWD are connected within the module. A connection end of the collector and the cathode is drawn out and connected to a collector electrode C2 provided on the upper surface of the 2-in-1 module 60. An emitter of the Si-IGBT and an anode of the SiC-FWD are connected within the module. A connection end of the emitter and the anode is drawn out and connected to an emitter electrode E2 provided on the upper surface of the 2-in-1 module 60.

As it is evident from the structure shown in FIG. 2 and the circuit configuration shown in FIG. 3, if the electrode E1 and the electrode C2 in the 2-in-1 module 60 are electrically connected by a conductor bar or the like, then a leg in which the first element pair 62 and the second element pair 64 are connected in series can be configured.

A reason why the power semiconductor module according to this embodiment can be configured as a 2-in-1 module compatibly using a package of the existing 1-in-1 module and without increasing the size of the existing 1-in-1 module is explained.

Figure 6:
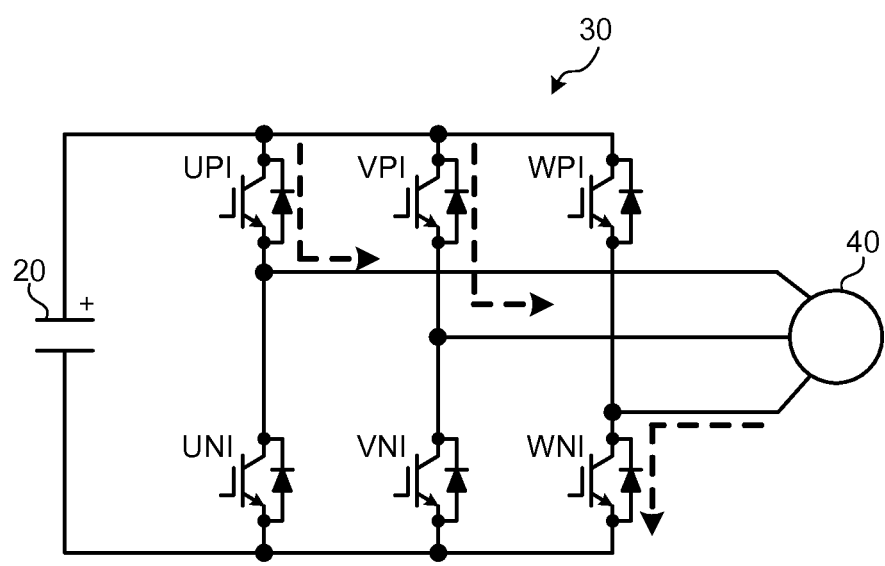
FIG. 6 is a diagram showing the direction of a main circuit electric current mainly flowing during a power running mode.

In a power running mode in which a car accelerates its running, an electric current flows from a positive electrode side of the capacitor 20 toward the motor 40. Therefore, for example, in a period in which an applied voltage for the U phase and the V phase is positive and an applied voltage for the W phase is negative, as shown in FIG. 6, an electric current flows into the motor 40 through the IGBTs of the switching elements UPI and VPI, and an electric current from the motor 40 returns to a negative electrode side of the capacitor 20 through the IGBT of the switching element WNI. As a result, during the power running mode, the IGBTs generate higher heat compared with the FWDs.

Figure 7:
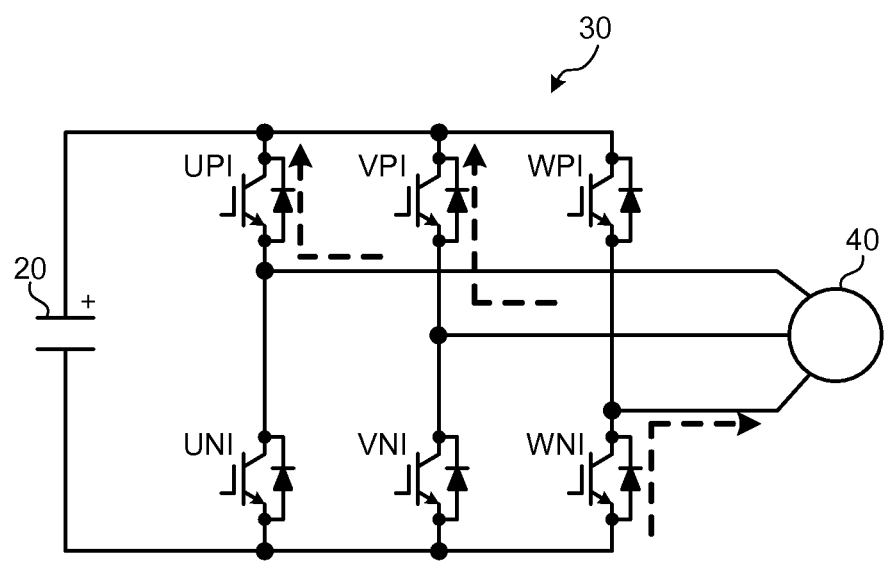
FIG. 7 is a diagram showing the direction of a main circuit electric current mainly flowing during a regenerative mode.

On the other hand, in a regenerative mode in which the car runs at a decelerated speed, the motor 40 functions as an electricity generator and an electric current from the motor 40 flows into the positive electrode side of the capacitor 20. Therefore, for example, in a period in which an induced voltage for the U phase and the V phase in the motor 40 is positive and an induced voltage for the W phase is negative, as shown in FIG. 7, an electric current flows into the capacitor 20 side through the FWDs of the switching elements UPI and VPI, and a return electric current of the electric current returns to the motor 40 through the FWD of the switching element WNI. As a result, during the regenerative mode, the FWDs generate higher heat compared with the IGBTs.

A heat value of a general-purpose 2-in-1 module is calculated using parameters shown in Table 1 below. The 2-in-1 module used herein includes silicon-based IGBTs (Si-IGBTs) and silicon-based FWDs (Si-FWDs).

TABLE 1

| | Parameters of the 2-in-1 module (Si-FWD) (Rated voltage: 1700 V, rated current: 1200 A) | |
|---|---|---|
| IGBT | ON voltage during 600 A energization | 1.65 V |
| | Switching loss during 600 A energization (Loss per one pulse) | 0.32 J/P |
| | Heat resistance between a bonding section and a case | 0.019 K/W |
| Si-FWD | ON voltage during 600 A energization | 2.1 V |
| | Switching loss during 600 A energization (Loss per one pulse) | 0.17 J/P |
| | Heat resistance between a bonding section and a case | 0.042 K/W |

A result obtained by calculating a heat value using the parameters shown in Table 1 and with an inverter current set to a half of the rated current (600 A) and a carrier frequency of inverter control set to 1 kHz is shown in Table 2 below. To obtain a simple calculation result, a power factor, inverter efficiency and the like are not taken into account.

TABLE 2

| | Temperature rise by the sample shown in Table 1 (calculation result) | | |
|---|---|---|---|
| IGBT | ON loss | 495 W | 600 A × 1.65 V ÷ 2 = 495 W (calculated assuming that an electric current for a half period flows to one IGBT) |
| | Switching loss | 160 W | 0.32 J × 1000 Hz ÷ 2 = 160 W |
| | Temperature rise | 12.5° C. | (495 W + 160 W) × 0.019 K/W = 12.5° C. |
| Si-FWD | ON loss | 630 W | 600 A × 2.1 V ÷ 2 = 630 W (calculated assuming that an electric current for a half period flows to one IGBT) |
| | Switching loss | 85 W | 0.17 J × 1000 Hz ÷ 2 = 85 W |
| | Temperature rise | 30° C. | (630 W + 85 W) × 0.042 K/W = 30° C. |

In Table 2 above, the ON losses of the IGBT and the FWD are calculated by dividing a product of a voltage and an electric current by 2 because it is assumed that an electric current for a half period flows to one IGBT, i.e., one IGBT and one FWD operate only for a half period of one period. The same holds true for the switching losses of the IGBT and the FWD, and so the number of pulses (switching frequency) is divided by 2.

As shown in the result of Table 2, whereas the temperature rise in the IGBT is 12.5° C., the temperature rise in the FWD is 30° C. It can be understood that the temperature rise in the FWD is higher.

We consider that a cooler is selected to set a case temperature of the module to 110° C. such that a bonding temperature for the IGBT becomes equal to or lower than an allowable bonding temperature. In this case, a bonding temperature for the FWD is 110° C.+30° C.=140° C., which exceeds an allowable bonding temperature of 125° C. for the FWD. Therefore, the 2-in-1 module indicated by Table 1 above can not be used as a module for a railway car.

Contrary to this view, we consider that a cooler adapted to the temperature rise in the FWD is selected. In this case, it is necessary to set the case temperature of the module to be equal to or lower than 125° C.−30° C.=90° C. For example, when the case temperature of the module is set to 90° C., a bonding temperature for the IGBT is 90° C.+12.5° C.=102.5° C. Because 125° C./102.5° C.=1.22, the cooler adapted to the temperature rise in the FWD has a margin of 20% or more with respect to the cooler adapted to the temperature rise in the IGBT. In other words, if it is attempted to configure the cooler adapted to the temperature rise in the FWD, then a cooler having higher performance is required. Therefore, the size of the cooler increases and a cost of the cooler increases.

A heat value of a general-purpose 1-in-1 module is calculated using parameters shown in Table 3 below. The 1-in-1 module used herein includes a silicon-based IGBT (Si-IGBT) and a silicon-based FWD (Si-FWD). The 1-in-1 module has a margin in terms of space compared with the 2-in-1 module, and so it can house one having less diode loss and less heat resistance than those of the FWD shown in Table 1.

TABLE 3

Parameters of the 1-in-1 module (Si-FWD) (Rated voltage: 1700 V, rated current: 1200 A)

| | | |
|---|---|---|
| IGBT | ON voltage during 600 A energization | 1.95 V |
| | Switching loss during 600 A energization (Loss per one pulse) | 0.41 J/P |
| | Heat resistance between a bonding section and a case | 0.012 K/W |
| Si-FWD | ON voltage during 600 A energization | 1.75 V |
| | Switching loss during 600 A energization (Loss per one pulse) | 0.12 J/P |
| | Heat resistance between a bonding section and a case | 0.02 K/W |

As in the case of Table 1, a result obtained by calculating a heat value using the parameters shown in Table 3 and with an inverter current set to a half of the rated current (600 A) and a carrier frequency of inverter control set to 1 kHz is shown in Table 4 below. To obtain a simple calculation result, as in Table 2, a power factor, inverter efficiency and the like are not taken into account.

TABLE 4

Temperature rise by the sample shown in Table 3 (calculation result)

| | | |
|---|---|---|
| IGBT | ON loss | 585 W  600 A × 1.95 V ÷ 2 = 585 W (calculated assuming that an electric current for a half period flows to one IGBT) |
| | Switching loss | 205 W  0.41 J × 1000 Hz ÷ 2 = 205 W |
| | Temperature rise | 9.5° C.  (585 W + 205 W) × 0.012 K/W = 9.5° C. |
| Si-FWD | ON loss | 525 W  600 A × 1.75 V ÷ 2 = 525 W (calculated assuming that an electric current for a half period flows to one IGBT) |
| | Switching loss | 60 W  0.12 J × 1000 Hz ÷ 2 = 60 W |
| | Temperature rise | 11.7° C.  (525 W + 60 W) × 0.02 K/W = 11.7° C. |

As indicated by the result shown in Table 4, the temperature rise in the IGBT is 9.5° C. and the temperature rise in the FWD is 11.7° C. Therefore, it is seen that there is no significant difference between the temperature rises in the IGBT and the FWD.

For example, we consider that a cooler is selected to set a case temperature of the module to 110° C. In this case, a bonding temperature for the FWD is 110° C.+11.7° C.=121.7° C., which is lower than the allowable bonding temperature 125° C. for the FWD. Therefore, the 1-in-1 module indicated by Table 3 above can be used as a module for a railway car.

Figure 8:
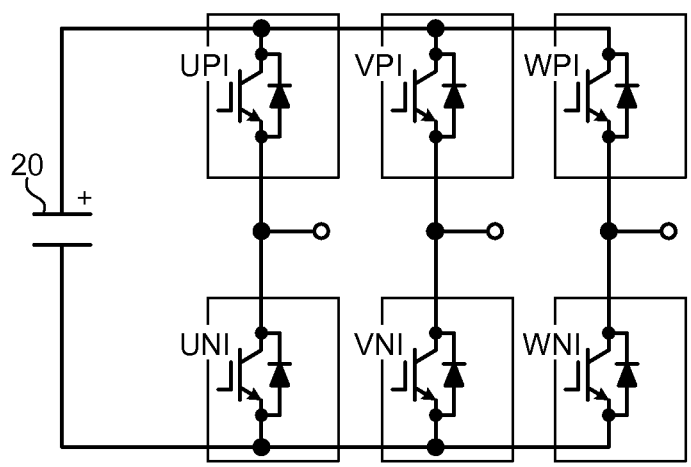
FIG. 8 is a circuit diagram of a three-phase inverter configured using six existing 1-in-1 modules.

As explained above, in the railway application including the power running mode and the regenerative mode, in the conventional 2-in-1 module, the temperature rise in the FWD is about twice as large as the temperature rise in the IGBT. Therefore, if the cooler has cooling performance adapted to the temperature rise in the IGBT, then the temperature rise in the FWD exceeds the allowable value. Therefore, the module can not be used for the application. On the contrary, if the cooler has cooling performance adapted to the temperature rise in the FWD, then the size of the cooler increases and a cost of the cooler increases. Therefore, in the conventional power converting apparatus applied to a railway car, a three-phase inverter is configured using six 1-in-1 modules having a small FWD loss and small heat resistance in order to prevent the size of the cooler from increasing and prevent a cost of the cooler from increasing (see FIG. 8).

Figure 9:
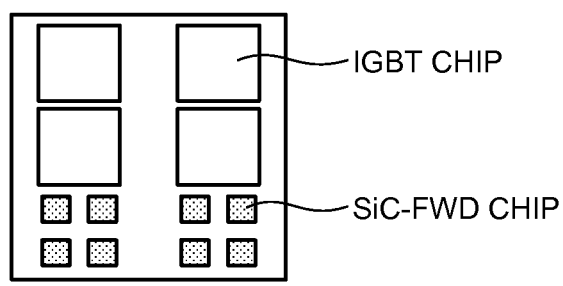
FIG. 9 is a diagram showing an arrangement example of one element pair in a 2-in-1 module according to the present embodiment configured using an SiC-FWD.
Figure 10:
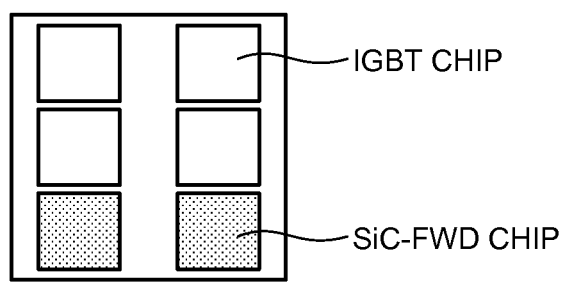
FIG. 10 is a diagram showing an arrangement example of one element pair in a conventional 2-in-1 module configured using an Si-FWD.

A chip arrangement (layout) in the 2-in-1 module according to this embodiment is explained. FIG. 9 is a diagram showing an arrangement example of one element pair in the 2-in-1 module according to this embodiment configured using the SiC-FWDs. In FIG. 10, an arrangement example of one element pair in the conventional 2-in-1 module configured using the Si-FWDs is shown as a comparative example.

As shown in FIG. 10, the conventional 2-in-1 module is configured using four IGBT chips and two Si-FWD chips per one element pair. In FIG. 10, an occupied area of the Si-FWD chips is about a half (50%) of an occupied area of the IGBT chips.

On the other hand, in the 2-in-1 module according to this embodiment, SiC is used for the FWD, so that it is possible to make an occupied area of the SiC-FWD chips smaller than the occupied area of the conventional Si-FWD chips. For example, as shown in FIG. 9, the 2-in-1 module has a configuration including four IGBT chips and eight Si—C FWD chips per one element pair. However, the occupied area of the SiC-FWD chips is about a quarter (25%) of the occupied area of the IGBT chips.

When SiC is used for the FWD, the ON voltage of the FWD can be reduced, so that the recovery loss can also be substantially reduced. In the case of SiC, chip thickness can also be reduced, so that heat resistance also decreases. For this reason, as shown in FIG. 9, it is possible to suppress the temperature rise in the FWDs to the same degree as the temperature rise in the IGBT module of the 1-in-1 type without changing the layout of the chips. In other words, when SiC is used for the FWD, even if a ratio of the occupied area of the SiC-FWD chips to the occupied area of the IGBT chips (hereinafter referred to as "FWD chip occupied area ratio") is smaller than 1/2, it is possible to suppress the temperature rise in the FWDs to the same degree as the temperature rise in the 1-in-1 type.

A result obtained by actually calculating a heat value of the 2-in-1 module in which SiC is used for the FWD chips, using parameters shown in Table 5 below is as shown in Table 6. In the calculation, as in Tables 2 and 4, a power factor, inverter efficiency and the like are not taken into account, an inverter current is set to 1/2 of the rated current (600 A), and a carrier frequency of inverter control is set to 1 kHz.

TABLE 5

Parameters of the 2-in-1 module (SiC-FWD) (Rated voltage: 1700 V, rated current: 1200 A)

| | | |
|---|---|---|
| IGBT | ON voltage during 600 A energization | 1.65 V |
| | Switching loss during 600 A energization (Loss per one pulse) | 0.32 J/P |
| | Heat resistance between a bonding section and a case | 0.019 K/W |
| SiC-FWD | ON voltage during 600 A energization | 1.3 V |
| | Switching loss during 600 A energization (Loss per one pulse) | 0.003 J/P |
| | Heat resistance between a bonding section and a case | 0.035 K/W |

TABLE 6

Temperature rise by the sample shown in Table 5 (calculation result)

| | | | |
|---|---|---|---|
| IGBT | ON loss | 495 W | 600 A × 1.65 V ÷ 2 = 495 W (calculated assuming that an electric current for a half period flows to one IGBT) |
| | Switching loss | 160 W | 0.32 J × 1000 Hz ÷ 2 = 160 W |
| | Temperature rise | 12.5° C. | (495 W + 160 W) × 0.019 K/W = 12.5° C. |
| Si-FWD | ON loss | 390 W | 600 A × 1.3 V ÷ 2 = 390 W (calculated assuming that an electric current for a half period flows to one IGBT) |
| | Switching loss | 1.5 W | 0.003 J × 1000 Hz ÷ 2 = 1.5 W |
| | Temperature rise | 13.7° C. | (390 W + 1.5 W) × 0.035 K/W = 13.7° C. |

As indicated by the result shown in Table 6, the temperature rise in the SiC-FWD chips is the same degree as the temperature rise in the IGBT chips. The temperature rise in the SiC-FWD chips can be reduced to a temperature rise value equal to or smaller than a half of 30° C. (see Table 2), which is a temperature rise value of the Si-FWD chips in the conventional 2-in-1 module. Even if a cooler adapted to the temperature rise in the IGBT chips to set a case temperature of the module to 110° C. is used, the bonding temperature of the FWD chips can be set to be equal to or lower than 125° C. of the bonding temperature allowable value.

Figure 11:
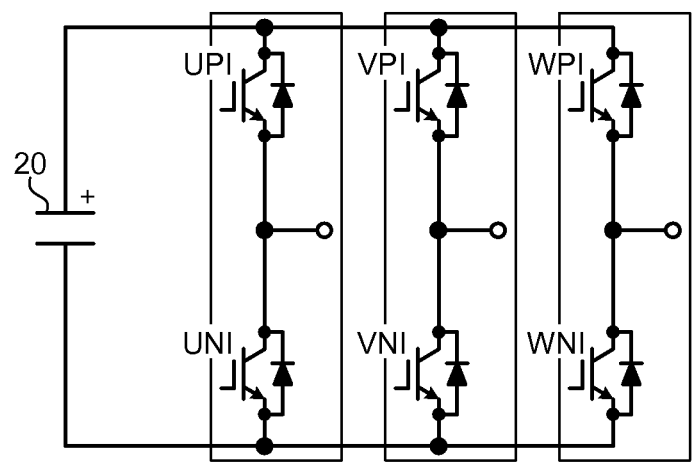
FIG. 11 is a circuit diagram of a three-phase inverter configured using three 2-in-1 modules according to the present embodiment.

Therefore, in the power converting apparatus according to this embodiment, as shown in FIG. 11, it is possible to configure a three-phase inverter using three 2-in-1 modules.

If a characteristic of SiC in that SiC can be used at high temperature is utilized, an allowable operating temperature of the SiC-FWD chips can be increased to 150° C. or higher and the occupied area of the SiC-FWD chips can be further reduced. Therefore, it is possible to further reduce the module size.

If the reduction in the occupied area of the SiC-FWD chips is allocated to an increase in the occupied area of the IGBT chips, it is possible to improve module performance without increasing the existing module size.

Further, the performance of the cooler for SiC can be reduced by virtue of increase in the allowable operating temperature of the SiC-FWD chips. Therefore, it is possible to reduce the size and costs of the cooler.

In this embodiment, the FWD chip occupied area ratio is explained as about 1/4 (=0.25), but is not limited to this numerical value of 1/4. The significance of the present invention resides in providing a 2-in-1 module applicable to a power converting apparatus for a railway application. Therefore, the FWD chip occupied area ratio can be any value as long as the significance can be realized.

For example, if a method in which the characteristic of SiC in that SiC can be used at high temperature is utilized as explained above or the reduction in the occupied area of the SiC-FWD chips is allocated to the IGBT chips is used, it is possible to further reduce the FWD chip occupied area ratio according to a synergistic effect of the reduction in the occupied area of the SiC-FWD chips and the increase in the occupied area of the IGBT chips. Herein, if a reduction effect by the former is estimated as 20% and a reduction effect by the latter is estimated as 20%, a reduction of about 40% by both the former and the latter is possible. It is thereby possible to reduce the FWD chip occupied area ratio to about 0.15 (=(1/4)×(1−0.4)).

In this embodiment, an incidental effect that the chip size of the 2-in-1 module can be reduced is obtained. This effect is obtained under the condition that the FWD chip occupied area ratio in the conventional 2-in-1 module can be reduced to be smaller than 1/2 by using SiC for the FWDs. However, in design of the conventional 2-in-1 module, an error of about ±10% occurs according to various design conditions. In view of these points, it is no exaggeration to say that the significance of the present invention resides in being capable of reducing the FWD chip occupied area ratio to be smaller than 0.45 (=0.5×(1−0.1)).

In this embodiment, the IGBTs are explained as an example of the switching elements for constructing the 2-in-1 module. However, MOSFETs can be mounted instead of the IGBTs. Because the MOSFETs have a switching loss smaller than that of the IGBTs, it is possible to realize reduction in size and reduction in cost of the module and the cooler by use of the MOSFETs.

If the SiC-FWD chips are formed in a size for equalizing the temperature rise in the SiC-FWD chips to the temperature rise in the IGBT chips forming the respective element pairs, the design of the cooler is easy. This is effective for reduction in size and reduction in cost of the cooler.

In this embodiment, the application to the inverter is explained as an example. However, application to a converter is naturally possible. In the application to the converter, in the conventional art, the converter is configured using four 1-in-1 modules. However, if the technique of this embodiment is used, the converter can be configured using two 2-in-1 modules. In the railway application, also in the case of the converter, an electric current flowing to the FWDs is larger than an electric current flowing to the IGBTs. Therefore, by applying SiC to the FWDs, it is possible to realize reduction in size and reduction in cost of the apparatus through reduction in loss and realize improvement of reliability through reduction in the number of components.

When the technique of this embodiment is applied to an auxiliary power supply device for a railway car, an inverter loss under a poor load power factor condition can be reduced. Therefore, it is possible to reduce the size of an inverter used in the auxiliary power supply device and realize reduction in size and reduction in cost of the device.

INDUSTRIAL APPLICABILITY

As described above, the present invention is useful for a power semiconductor module and a power converting apparatus that can be a further downsized and are applicable to a railway car.

REFERENCE SIGNS LIST

1 OVERHEAD LINE
2 CURRENT COLLECTOR
3 WHEEL
4 RAIL
6 TRANSFORMER
10 CONVERTER
20 CAPACITOR
30 INVERTER
40 MOTOR
50 POWER CONVERTING APPARATUS
60 2-IN-1 MODULE
62 ELEMENT PAIR (FIRST ELEMENT PAIR)
64 ELEMENT PAIR (SECOND ELEMENT PAIR)
72 ELEMENT PAIR
70 1-IN-1 MODULE
100 RAILWAY CAR
C, C1, C2 COLLECTOR ELECTRODES
E, E1, E2 EMITTER ELECTRODES
UNC, VNC, WNC, UNI, VNI, WNI, UPC, VPC, WPC, UPI, VPI, WPI, SWITCHING ELEMENTS

The invention claimed is:

1. A power semiconductor module comprising:
a first element pair formed by connecting, in reverse parallel to each other, a first switching element and a first diode element formed by a wide band gap semiconductor in a size for setting a ratio of an occupied area of the first diode element with respect to an occupied area of the first switching element to be equal to or higher than 15% and lower than 45% of the occupied area of the first switching element; and
a second element pair formed by connecting, in reverse parallel to each other, a second switching element and a second diode element formed by a wide band gap semiconductor in a size for setting a ratio of an occupied area of the second diode element with respect to an occupied area of the second switching element to be equal to or higher than 15% and lower than 45% of the occupied area of second switching element, wherein
the first switching element and the first diode element are arranged so as not to overlap when viewed in plan view,
the second switching element and the second diode element are arranged so as not to overlap when viewed in plan view, and the first element pair and the second element pair are housed in one module and configured as a 2-in-1 module.

2. The power semiconductor module according to claim 1, wherein the first and second diode elements and the first and second switching elements are formed in sizes for equalizing temperature rises.

3. The power semiconductor module according to claim 1, wherein the wideband gap semiconductor is semiconductor formed using silicon carbide, a gallium nitride base material or diamond.

4. The power semiconductor module according to claim 1, wherein the first and second switching elements are IGBT elements or MOSFET elements.

5. The power semiconductor module according to claim 1, further comprising:
a first collector electrode to which a collector of the first switching element and a cathode of the first diode element are connected;
a first emitter electrode to which an emitter of the first switching element and an anode of the first diode element are connected;
a second collector electrode to which a collector of the second switching element and a cathode of the second diode element are connected; and
a second emitter electrode to which an emitter of the second switching element and an anode of the second diode element are connected,
the first collector electrode, the first emitter electrode, the second collector electrode, and the second emitter electrode being provided on an upper surface of the power semiconductor module.

6. The power semiconductor module according to claim 5, wherein the first and second diode elements and the first and second switching elements are formed in sizes for equalizing temperature rises.

7. The power semiconductor module according to claim 1, wherein the first and second diode elements and the first and second switching elements include a plurality of chips, and a number of the chips included in the first and second diode elements is larger than a number of the chips included in the first and the second switching elements.

8. A power converting apparatus comprising a power semiconductor module configured as a 2-in-1 module that houses:
a first element pair formed by connecting, in reverse parallel to each other, a first switching element and a first diode element formed by a wide band gap semiconductor in a size for setting a ratio of an occupied area of the first diode element with respect to an occupied area of the first switching element to be equal to or higher than 15% and lower than 45% of the occupied area of the first switching element; and
a second element pair formed by connecting, in reverse parallel to each other, a second switching element and a second diode element formed by a wide band gap semiconductor in a size for setting a ratio of an occupied area the second diode element with respect to an occupied area of the second switching element to be equal to or higher than 15% and lower than 45% of the occupied area of the second switching element, wherein the first switching element and the first diode element are arranged so as not to overlap when viewed in plan view, and the second switching element and the second diode element are arranged so as not to overlap when viewed in plan view.

9. The power converting apparatus according to claim 8 mounted on a vehicle and configured to supply electric power to an electric motor that drives the vehicle, wherein
an electric current flows to the first diode element and the second diode element during acceleration of the vehicle, and
an electric current flows to the first switching element and the second switching element during deceleration of the vehicle.

10. The power converting apparatus according to claim 8 mounted on a vehicle and configured to supply electric power to an electric motor that drives the vehicle, wherein
an electric current flows to the first switching element and the second switching element during acceleration of the vehicle, and
an electric current flows to the first diode element and the second diode element during deceleration of the vehicle.

11. A railroad vehicle comprising:
the power converting apparatus according to claim 8 mounted on a vehicle and configured to supply electric power to an electric motor that drives the vehicle; and
the electric motor supplied with the electric power from the power converting apparatus to generate a driving force.

12. The power converter apparatus according to claim 8, wherein the first and second diode elements and the first and second switching elements include a plurality of chips, and a number of the chips included in the first and second diode elements is larger than a number of the chips included in the first and the second switching elements.

13. The power converter apparatus according to claim 8, wherein the first and second diode elements and the first and second switching elements are formed in sizes for equalizing temperature rises.

* * * * *